(12) United States Patent
Wang et al.

(10) Patent No.: US 10,999,482 B2
(45) Date of Patent: May 4, 2021

(54) IMAGE CAPTURING DEVICE

(71) Applicant: ASIA VITAL COMPONENTS CO., LTD., New Taipei (TW)

(72) Inventors: Wei-Chuan Wang, New Taipei (TW); Ting-Yu Lin, New Taipei (TW); Chin-Liang Yeh, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 0 days.

(21) Appl. No.: 16/503,479

(22) Filed: Jul. 4, 2019

(65) Prior Publication Data
US 2021/0006697 A1     Jan. 7, 2021

(51) Int. Cl.
*G02B 13/00*     (2006.01)
*H04R 1/04*     (2006.01)
(Continued)

(52) U.S. Cl.
CPC ......... *H04N 5/2256* (2013.01); *G02B 13/008* (2013.01); *H04N 5/2253* (2013.01); *H04N 5/2254* (2013.01); *H04R 1/028* (2013.01); *H04R 1/04* (2013.01); *H04R 1/406* (2013.01); *H04R 3/005* (2013.01); *H05K 1/0203* (2013.01); *H05K 1/181* (2013.01); *H01R 12/716* (2013.01);
(Continued)

(58) Field of Classification Search
CPC .. H04N 5/2256; H04N 5/2253; H04N 5/2254; G02B 13/008; H04R 1/028; H04R 1/04; H04R 1/406; H04R 3/005; H05K 1/181; H05K 2201/06; H05K 2201/10083; H05K 2201/10106; H05K 2201/10121; H05K 2201/10151; H05K 2201/10522; H01R 12/716
See application file for complete search history.

(56) References Cited

U.S. PATENT DOCUMENTS

| 2004/0263670 | A1* | 12/2004 | Yamasaki | ......... H01L 27/14623 348/340 |
| 2008/0265134 | A1* | 10/2008 | Kinoshita | ............ H04N 5/2257 250/206 |
| 2010/0034530 | A1* | 2/2010 | Son | ........................ G03B 17/00 396/427 |
| 2010/0244171 | A1* | 9/2010 | Nagamatsu | ....... H01L 27/14623 257/433 |

(Continued)

FOREIGN PATENT DOCUMENTS

| CN | 207491128 U | * | 6/2018 | ............... H04N 9/04 |
| CN | 108600435 A | | 9/2018 | |

(Continued)

*Primary Examiner* — Reza Aghevli
(74) *Attorney, Agent, or Firm* — Thomas J. Nikolai; DeWitt LLP

(57) ABSTRACT

An image capturing device includes a circuit board, an image capturing module, a light source module disposed on the circuit board and a connection body disposed above the light source module. The image capturing module has a first lens set and a second lens set disposed on the circuit board. The connection body has a first connection section having a first open end and a second open end. The first open end of the first connection section abuts against the light-emitting component or the upper side of the circuit board in adjacency to the light-emitting component. The first and second open ends together define a first light passage. The light-emitting component is positioned in the first light passage. The image capturing device can effectively avoid light leakage of the image.

16 Claims, 9 Drawing Sheets

(51) Int. Cl.
    *H04R 3/00*          (2006.01)
    *H05K 1/18*          (2006.01)
    *H04N 5/225*        (2006.01)
    *H05K 1/02*          (2006.01)
    *H04R 1/40*          (2006.01)
    *H04R 1/02*          (2006.01)
    *H01R 12/71*        (2011.01)

(52) U.S. Cl.
    CPC ................. *H05K 2201/066* (2013.01); *H05K 2201/10083* (2013.01); *H05K 2201/10106* (2013.01); *H05K 2201/10121* (2013.01); *H05K 2201/10151* (2013.01); *H05K 2201/10522* (2013.01)

(56) References Cited

U.S. PATENT DOCUMENTS

| | | | | |
|---|---|---|---|---|
| 2013/0100084 A1* | 4/2013 | Son | ......................... | H05K 13/00 |
| | | | | 345/175 |
| 2013/0100085 A1* | 4/2013 | Son | ....................... | G06F 3/0428 |
| | | | | 345/175 |
| 2013/0106787 A1* | 5/2013 | Lee | ..................... | H04N 5/2251 |
| | | | | 345/175 |
| 2018/0321460 A1* | 11/2018 | Lee | .......................... | G03B 3/10 |

FOREIGN PATENT DOCUMENTS

| | | | | |
|---|---|---|---|---|
| CN | 109299712 A | * | 2/2019 | ............... G06K 9/20 |
| CN | 209218192 U | * | 8/2019 | ............. H04N 5/225 |
| TW | 201218760 A1 | | 5/2012 | |
| TW | M557888 U | | 4/2018 | |

* cited by examiner

IMAGE CAPTURING DEVICE

BACKGROUND OF THE INVENTION

1. Field of the Invention

The present invention relates generally to an image capturing device, and more particularly to an image capturing device, which can avoid light leakage of the image.

2. Description of the Related Art

Face recognition is a newly developed biological recognition technique capable of automatically identifying a person according to the face features thereof. Face recognition technique widely employs district feature analysis algorithm in combination with computer image processing technique to capture features of human image from the video and set up a mathematical model by means of relevant principle analysis to further achieve the face recognition function.

The conventional face recognition device mainly includes a lens, an infrared light-emitting diode (IR LED), an LED indication light in adjacency to the IR LED and a cover body covering the lens, the IR LED and the LED indication light. The IR LED emits infrared ray to a human face. The infrared ray is reflected back from the human face to be received by the lens so as to obtain the face image and achieve the face recognition (or identification) function. The IR LED requires higher brightness so that it is necessary to use infrared ray with high brightness. As a result, the infrared ray of the IR LED is very easy to penetrate into a base seat of the lens. This will lead to the problem of light leakage of the image in the lens. As a result, the accuracy of the face recognition will be lowered or even the face recognition device will fail to recognize the face. In addition, when the IR LED and the LED indication light emit infrared ray and the indication light beam through a perforation of the cover body, part of the light is projected onto the inner side of the cover body and refracted. The refracted light will be projected onto the lens to cause the problem of image refraction. This will lower the accuracy of the face recognition (or identification) or even the face recognition device will fail to recognize the face.

Moreover, the LED indication light is disposed beside the IR LED and spaced from the IR LED by a short distance. Therefore, the light emitted from the LED indication light and the infrared ray emitted from the IR LED will interfere with each other. This will lead to the problem of poor appearance.

SUMMARY OF THE INVENTION

It is therefore a primary object of the present invention to provide an image capturing device, which can avoid light leakage of the image.

It is a further object of the present invention to provide the above image capturing device, in which a connection body is used to isolate an infrared (IR) light-emitting component and avoid leakage of the light emitted from the IR light-emitting component. In this case, the face recognition efficiency can be enhanced and the entire appearance of the image capturing device can be promoted.

To achieve the above and other objects, the image capturing device of the present invention includes a circuit board, an image capturing module mounted on the circuit board and including, a LED light source module and a connection body. The circuit board has an upper side and a lower side. The image capturing module has a first lens set and a second lens set. The first and second lens sets are respectively disposed on the upper side of the circuit board and electrically connected therewith. The light source module has an IR light-emitting LED component and a LED visible light source component disposed on the upper side of the circuit board and electrically connected therewith. The connection body is correspondingly disposed above the LED light source module. The connection body has a first connection section. The first connection section has a first open end and a second open end corresponding to the first open end. The first open end abuts against the IR light-emitting component or the upper side of the circuit board in adjacency to the IR light-emitting component. The first and second open ends together define a first light passage. The IR light-emitting component is positioned in the first light passage. The image capturing device of the present invention can avoid light leakage of the image and enhance the entire appearance from the image capturing device and enhance the face recognition efficiency.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
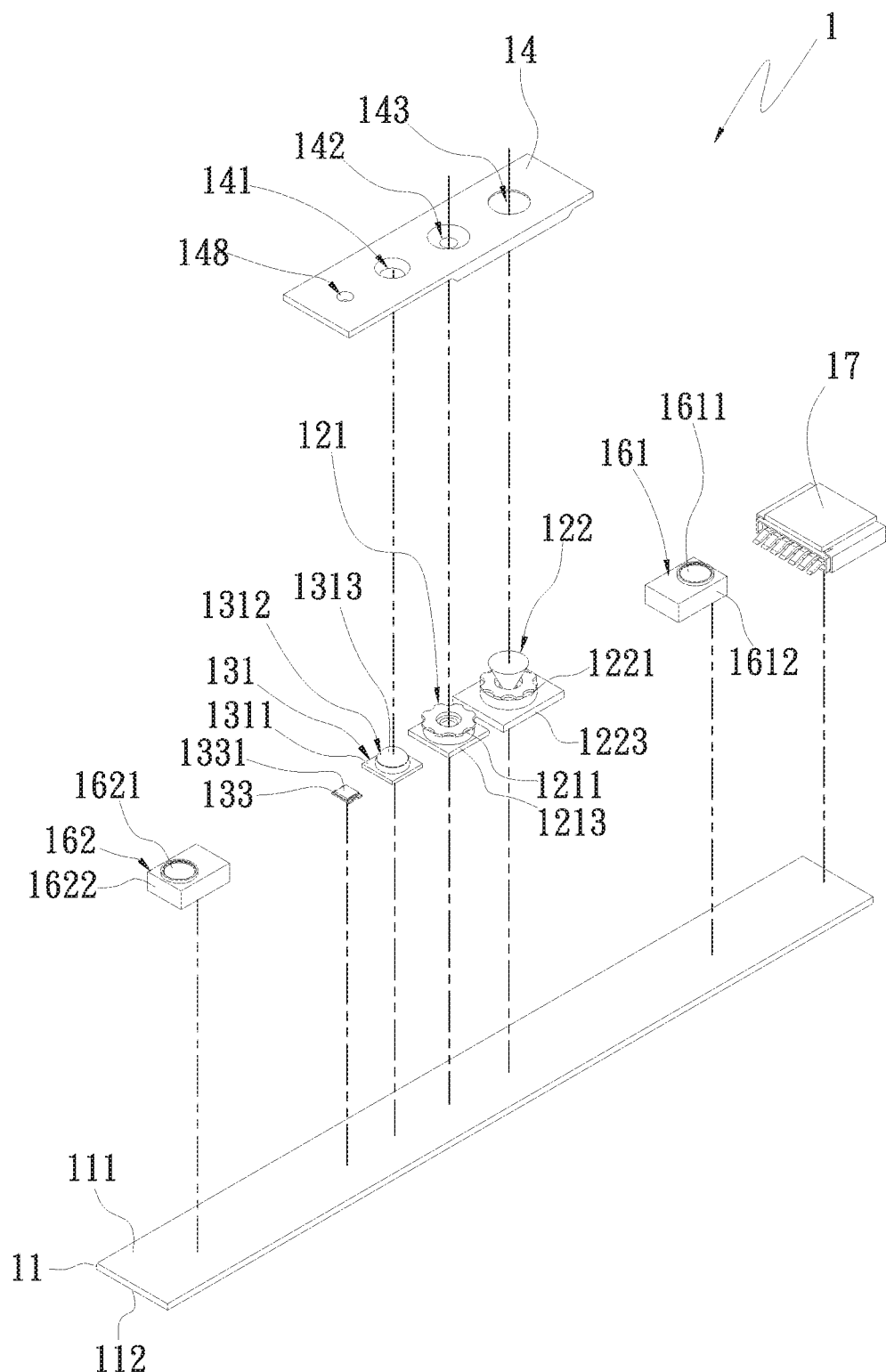
FIG. 1 is a perspective exploded view of a first embodiment of the present invention.
Figure 2A:
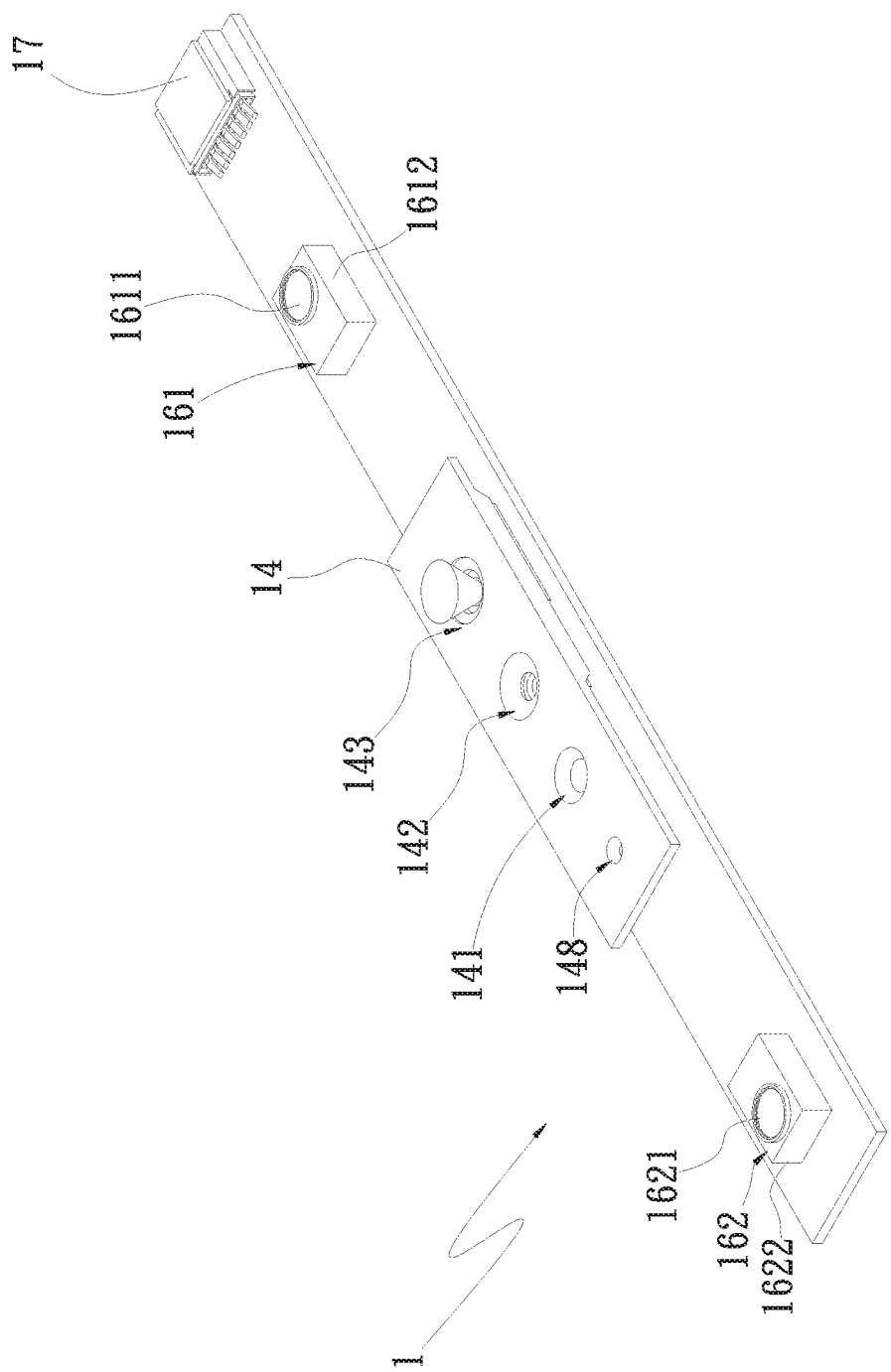
FIG. 2A is a perspective assembled view of the first embodiment of the present invention.
Figure 2B:
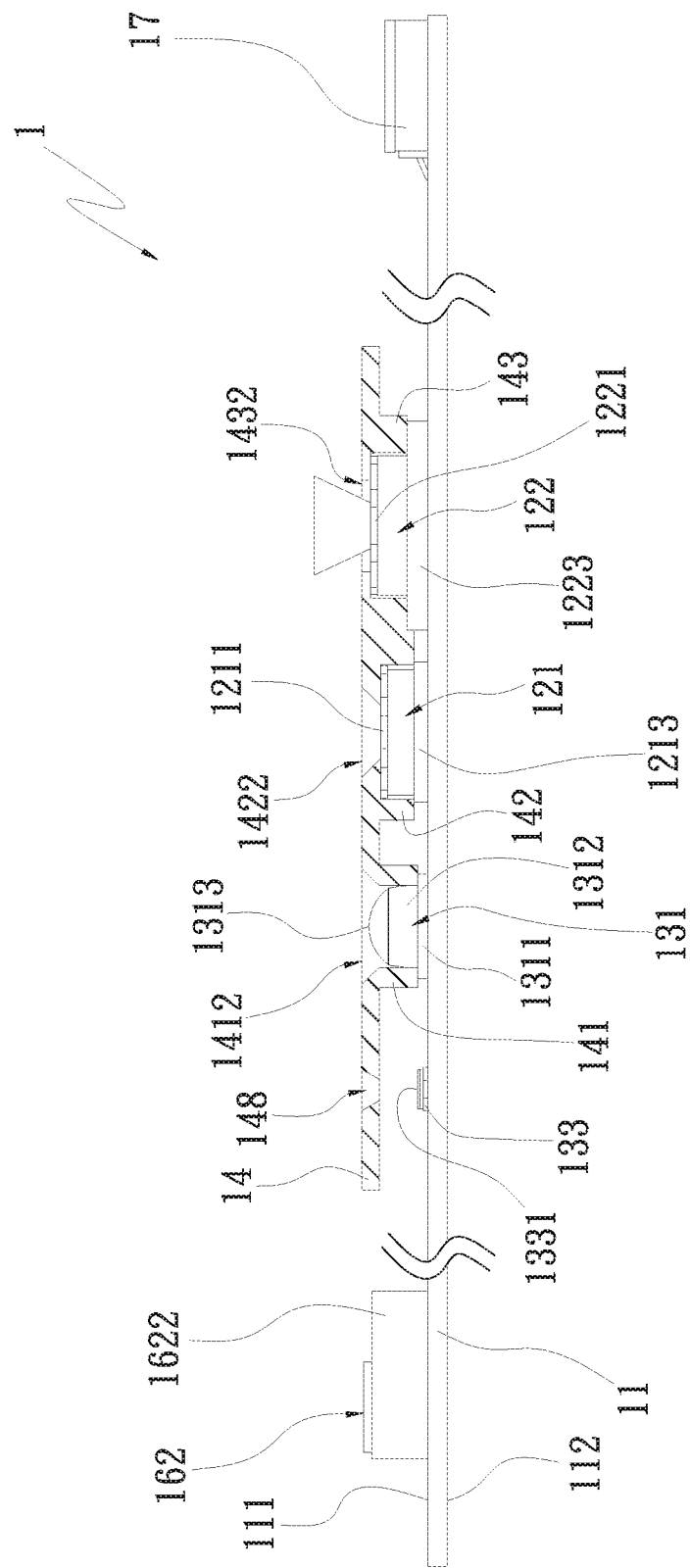
FIG. 2B is a sectional view of the first embodiment of the present invention.
Figure 3A:
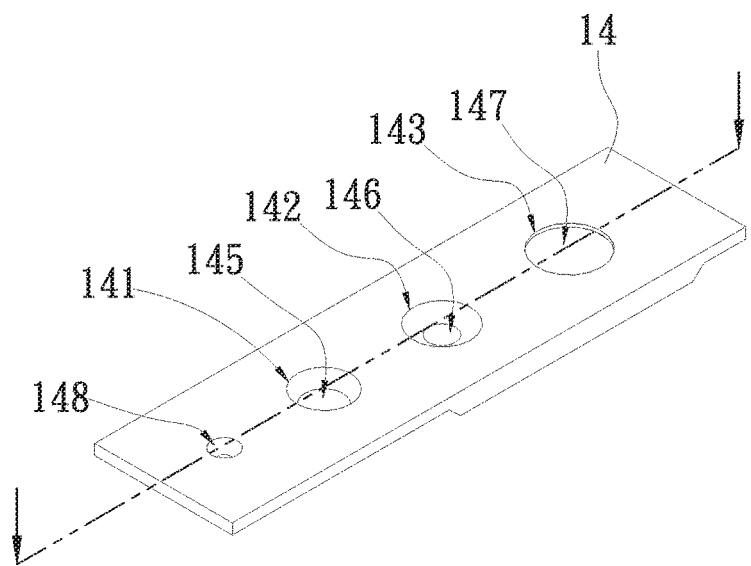
FIG. 3A is a perspective view of the connection body of the present invention.
Figure 3B:
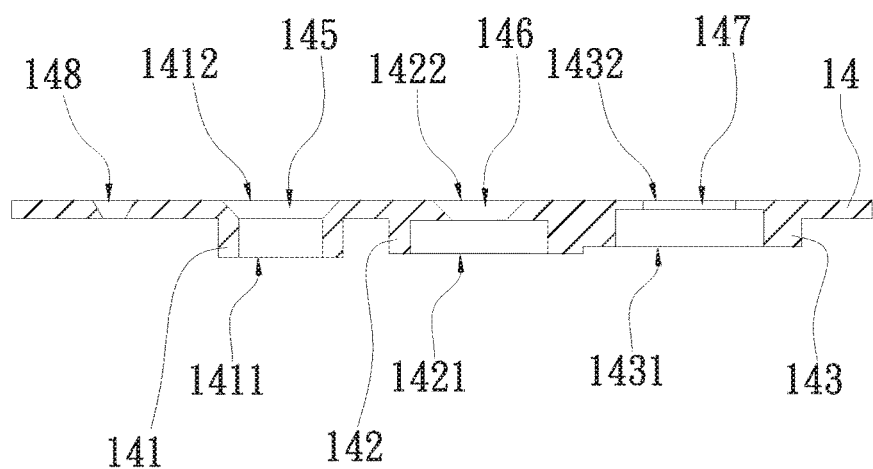
FIG. 3B is a sectional view of the connection body of the present invention.
Figure 4:
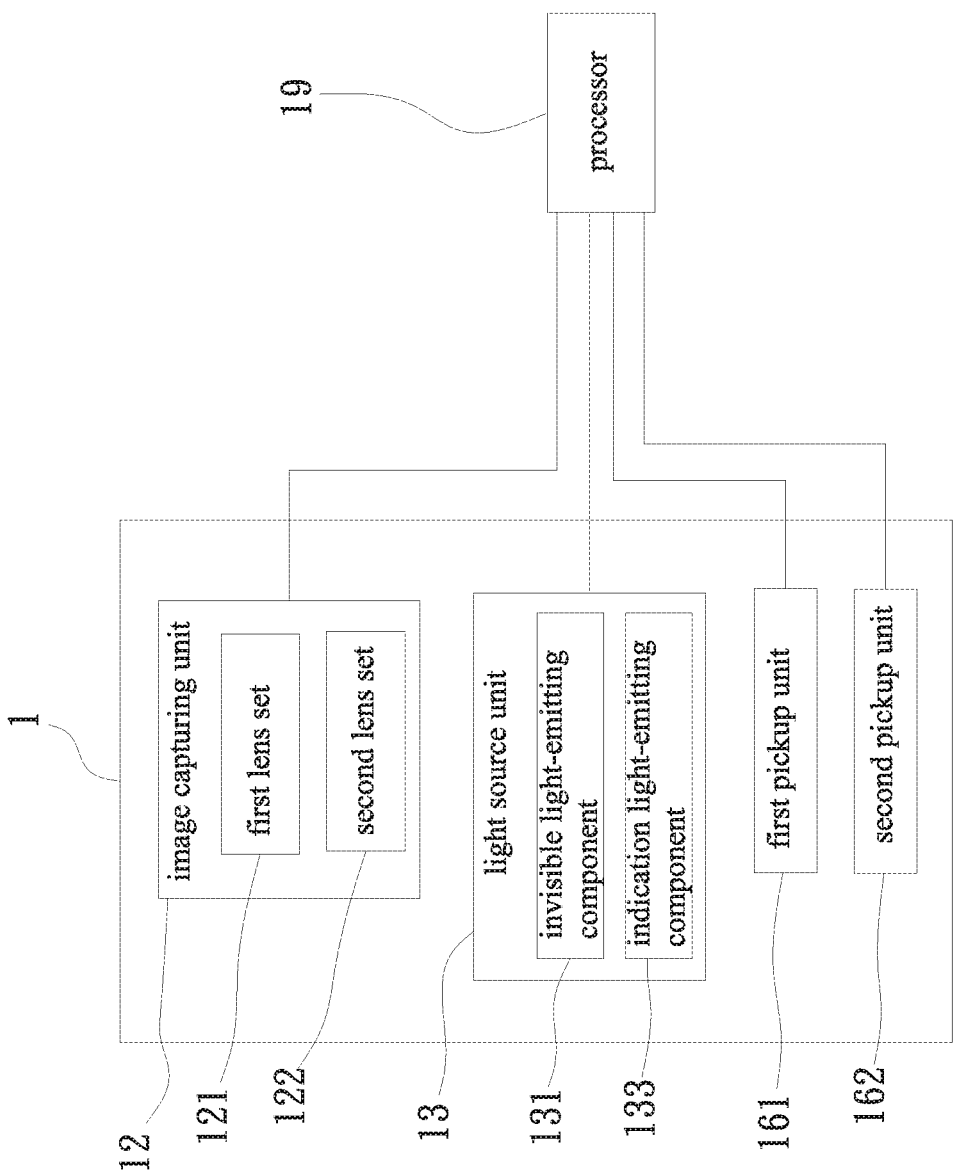
FIG. 4 is a block diagram of the first embodiment of the present invention.

Please refer to FIGS. 1 to 4. FIG. 1 is a perspective exploded view of a first embodiment of the present invention. FIG. 2A is a perspective assembled view of the first embodiment of the present invention. FIG. 2B is a sectional view of the first embodiment of the present invention. FIG. 3A is a perspective view of the connection body of the present invention. FIG. 3B is a sectional view of the connection body of the present invention. FIG. 4 is a block diagram of the first embodiment of the present invention. According to the first embodiment, the image capturing device 1 of the present invention is applied to an electronic device (such as intelligent mobile device, a tablet, a camera, a computer, a notebook or an access control system, not shown) for object recognition (such as face recognition). In this embodiment, the object recognition is, but not limited to, face recognition for illustration purposes. In practice, the image capturing device 1 of the present invention can be also used for other biological recognition (such as iris recognition). The image capturing device 1 includes a circuit board 11, an image capturing module 12, a light source module 13 and a connection body 14. In this embodiment, the circuit board 11 is a printed circuit board (PCB, such as a flexible printed circuit board or a rigid printed circuit board). The circuit board 11 has an upper side 111 and a lower side 112 opposite to the upper side 111. The image capturing module 12 has a first lens set 121 and a second lens set 122. In this embodiment, the first lens set 121 is an infrared lens for detecting/capturing the infrared ray reflected from the recognized object (such as a user's face) and converting the infrared ray into an infrared image. In this embodiment, the second lens set 122 is a charge-coupled device (CCD) lens for capturing colorful image (or recording colorful image and film). The first and second lens sets 121, 122 are respectively disposed on the upper side 111 of the circuit board 11 and electrically connected therewith. In practice, the second lens set 122 can be a complementary metal oxide semiconductor transistors (CMOS) lens or an infrared lens.

The light source module 13 has a light-emitting component 131 for emitting IR radiation and an indication light-emitting component 133 emitting visible light. In this embodiment, the IR light-emitting component 131 is preferably an infrared light-emitting diode (IR LED) serving as a fill light source. The indication light-emitting component 133 is a visible light-emitting diode (such as a red light-emitting diode, a white light-emitting diode or a multicolor light-emitting diode). The IR light-emitting component 131 and the indication light-emitting component 133 are respectively disposed on the upper side 111 of the circuit board 11 and electrically connected therewith in adjacency to each other. The IR light-emitting component 131 has a base seat 1311 and a lens 1312 disposed on the base seat 1311. The lens 1312 has a light-emitting face 1313 for projecting invisible light (such as infrared ray).

The connection body 14 is correspondingly disposed above the light source module 13. In this embodiment, the connection body 14 is, but not limited to, a nontransparent soft pad such as a nontransparent soft rubber or other nontransparent soft material (such as nontransparent soft plastic pad). In practice, the connection body 14 can be alternatively a nontransparent hard pad with protection and shielding effect. For example, the connection body 14 can be a nontransparent metal or other nontransparent hard material (such as nontransparent hard rubber). The connection body 14 has a first connection section 141, a second connection section 142, a third connection section 143 and a perforation 148. The first, second and third connection sections 141, 142, 143 are disposed on the connection body 14 in positions where the IR light-emitting component 131 and the first and second lens sets 121, 122 are positioned. The first connection section 141 has a first open end 1411 and a second open end 1412 corresponding to the first open end 1411. In this embodiment, the first open end 1411 outward extends from the connection body 14 to abut against the base seat 1311 of the IR light-emitting component 131. The first connection section 141 encloses the IR light-emitting component 131 from the base seat 1311 of the IR light-emitting component 131 to the top thereof. The first and second open ends 1411, 1412 together define a first light passage 145. The lens 1312 associated with the IR light-emitting component 131 is positioned in the first light passage 145 and the light-emitting face 1313 of the lens 1312 faces the second open end 1412. When the IR light-emitting component 131 emits infrared rays, the light-emitting face 1313 of the IR light-emitting component 131 in the first light passage 145 will project infrared rays to pass through the second open end 1412 and project onto a corresponding recognized object (such as a user's face).

The second connection section 142 is adjacent to the first connection section 141. The second connection section 142 has a third open end 1421 and a fourth open end 1422 corresponding to the third open end 1421. The third open end 1421 outward extends from the connection body 14 to abut against a lens base seat 1213 of the first lens set 121. The third and fourth open ends 1421, 1422 together define a second light passage 146. The lens 1211 of the first lens set 121 is positioned in the second light passage 146 to face the fourth open end 1422. The infrared ray reflected from the recognized object (the user's face) will pass through the fourth open end 1422 into the second light passage 146 to be received by the first lens set 121. The third connection section 143 is adjacent to the second connection section 142. The third connection section 143 has a fifth open end 1431 and a sixth open end 1432 corresponding to the fifth open end 1431. The fifth open end 1431 outward extends from the connection body 14 to abut against a lens base seat 1223 of the second lens set 122. The fifth and sixth open ends 1431, 1432 together define a third light passage 147. The lens 1221 of the second lens set 122 is positioned in the third light passage 147 to face the sixth open end 1432. Through the sixth open end 1432, the second lens set 122 captures (or picks up) colorful image (such the image of the user's face or the image of the surrounding).

In a preferred embodiment, the first open end 1411 of the first connection section 141 outward extends from the connection body 14 to abut against the upper side 111 of the circuit board 11 in adjacency to the base seat, whereby the entire IR light-emitting LED component 131 (including the lens 1312 and the base seat 1311) is positioned in the first light passage 145. The third open end 1421 of the second connection section 142 outward extends from the connection body 14 to abut against the upper side 111 of the circuit board 11 in adjacency to the lens base seat 1213 of the first lens set 121. The fifth open end 1431 of the third connection section 143 outward extends from the connection body 14 to abut against the upper side 111 of the circuit board 11 in adjacency to the lens base seat 1223 of the second lens set 122. Accordingly, the first and second lens sets 121, 122 are entirely respectively positioned in the second and third light passages 146, 147. In a modified embodiment, the second connection section 142 of the connection body 14 is disposed between the lens 1211 of the first lens set 121 and a lens protection plate thereon (not shown). The third connection section 143 of the connection body 14 is disposed between the lens 1221 of the second lens set 122 and a lens protection plate thereon (not shown).

In a modified embodiment, the second and third connection sections 142, 143 are omitted. Only the IR light-emitting component 131 is isolated and enclosed in the first connection section 141. Accordingly, the infrared ray emitted from the IR light-emitting component 131 will only pass through the first light passage 145 to project out of the second open end 1412 without projecting to the adjacent first and second lens sets 121, 122 and the visible indication LED light-emitting component 133 on two sides (or in the surrounding). In this case, the infrared ray emitted from the IR light-emitting component 131 is prevented from being projected to the first and second lens sets 121, 122 and the indication light-emitting component 133. Therefore, the lenses 1211, 1221 in the first and second lens sets 121, 122 are free from the interference of light leakage. Accordingly, the image capturing device 1 of the present invention can effectively avoid light leakage of the image and enhance face recognition efficiency.

The perforation 148 of the connection body 14 is formed on the connection body 14 in adjacency to the first connection section 141 corresponding to the visible indication light-emitting component 133. The light-emitting face 1331 of the indication light-emitting component 133 emits light to outward project from the perforation 148 so as to provide an indication message for a user. For example, by means of observing whether the indication light, (that is, the indication light-emitting component 133) is lighted up or extinguished, the user can know whether the image capturing device 1 is powered on or off. Alternatively, in the case that the indication light-emitting component 133 continuously flickers, the user can know that the first lens set 121 normally functions. According to the above arrangement, the first, second and third connection sections 141, 142, 143 of the connection body 14 enclose the corresponding IR light-emitting component 131 and the first and second lens sets 121, 122. Therefore, the IR light-emitting component 131 and the first and second lens sets 121, 122 on the circuit board 11 are respectively independently enclosed and isolated (or separated from each other). In addition, the IR light-emitting component 131 and the first and second lens sets 121, 122 are respectively positioned in the corresponding first, second and third light passages 145, 146, 147. In this case, the infrared ray emitted from the IR light-emitting component 131 is isolated by the first connection section 141 without projecting to the adjacent first and second lens sets 121, 122 and the indication light-emitting component 133 on two sides (or in the surrounding). Therefore, the image capturing device 1 of the present invention can effectively avoid light leakage of the image and the interference between the IR light-emitting component 131 and the visible indication light-emitting component 133 can be avoided. In addition, the lenses 1211, 1221 of the first and second lens sets 121, 122 are isolated (or shielded) by the second and third connection sections 142, 143 so that the user will not directly see the appearance of the peripheries of the lenses 1211, 1221 of the first and second lens sets 121, 122, (such as petal-shaped appearance). In this case, the appearance of the peripheries of the lenses 1211, 1221 is beautified and the entire appearance of the image capturing device 1 is enhanced.

Please refer to FIGS. 1, 2B, 3B and 4. The image capturing device 1 of the present invention further includes a first audio pickup module 161, a second audio pickup module 162, a connector 17 and a processor 19. The first and second audio pickup modules 161, 162 and the connector 17 are disposed on the upper side 111 of the circuit board 11 and electrically connected therewith in adaptation to the application of the electronic device. The first audio pickup module 161 has a first microphone 1611 and a first nontransparent soft pad 1612 enclosing the first microphone 1611. A sound hole of the first microphone 1611 is not covered by the first nontransparent soft pad 1612. The first nontransparent soft pad 1612 serves to protect and conceal the first microphone 1611 therein. The second audio pickup module 162 has a second microphone 1621 and a second nontransparent soft pad 1622 enclosing the second microphone 1621. A sound hole of the second microphone 1621 is not covered by the second nontransparent soft pad 1622. The second nontransparent soft pad 1622 serves to protect and conceal the second microphone 1621 therein. In practice, the first and second nontransparent soft pads 1612, 1622 can be replaced with nontransparent hard pads with protection and shielding effect, such as nontransparent hard pads made of metal or other nontransparent hard material (such as nontransparent hard rubber).

The connector 17 is a USB connector, a C-type USB connector, a flexible flat cable connector or a wireless transceiver for connecting the image capturing device 1 to other devices. In this embodiment, the connector 17 serves to connect the image capturing device 1 to a port of an electronic device. The processor 19 (such as digital signal processor (DSP) or image processor) is electrically connected with the circuit board 11. In this embodiment, the processor 19 may comprise a processor DSP 19 inside the electronic device. The processor 19 serves to process the received image, signal or other data. For example, according to the received infrared image and a preset feature database (such as a preset face feature database), the processor 19 processes and recognizes the image. Alternatively, the processor 19 serves to process the signal received by the first and second microphones 1611, 1621. In a preferred embodiment, the processor 19 is disposed on the upper side 111 of the circuit board 11 and electrically connected therewith and positioned between the first audio pickup module 161 and the second lens set 122. In another embodiment, the processor 19 is not disposed on the upper side 111 of the circuit board 11. Instead, the processor 19 is electrically connected to the upper side 111 of the circuit board 11 via a signal cable (such as signal flexible flat cable).

Therefore, the image capturing device 1 of the present invention can effectively avoid light leakage of the image and enhance face recognition (or identification) efficiency and face recognition accuracy. Moreover, the appearance of the entire image capturing device 1 is enhanced.

Figure 5A:
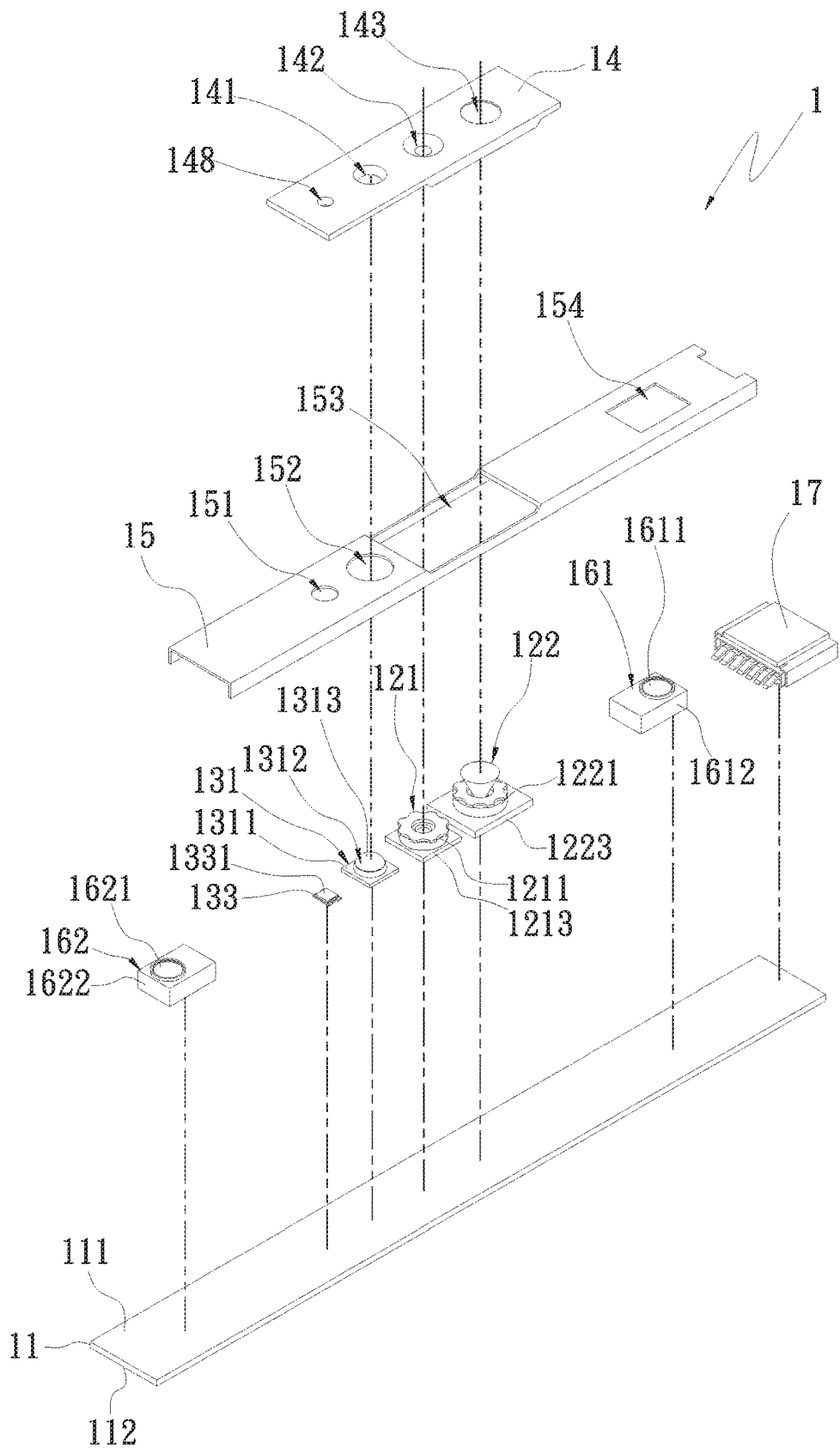
FIG. 5A is a perspective exploded view of a second embodiment of the present invention.
Figure 5B:
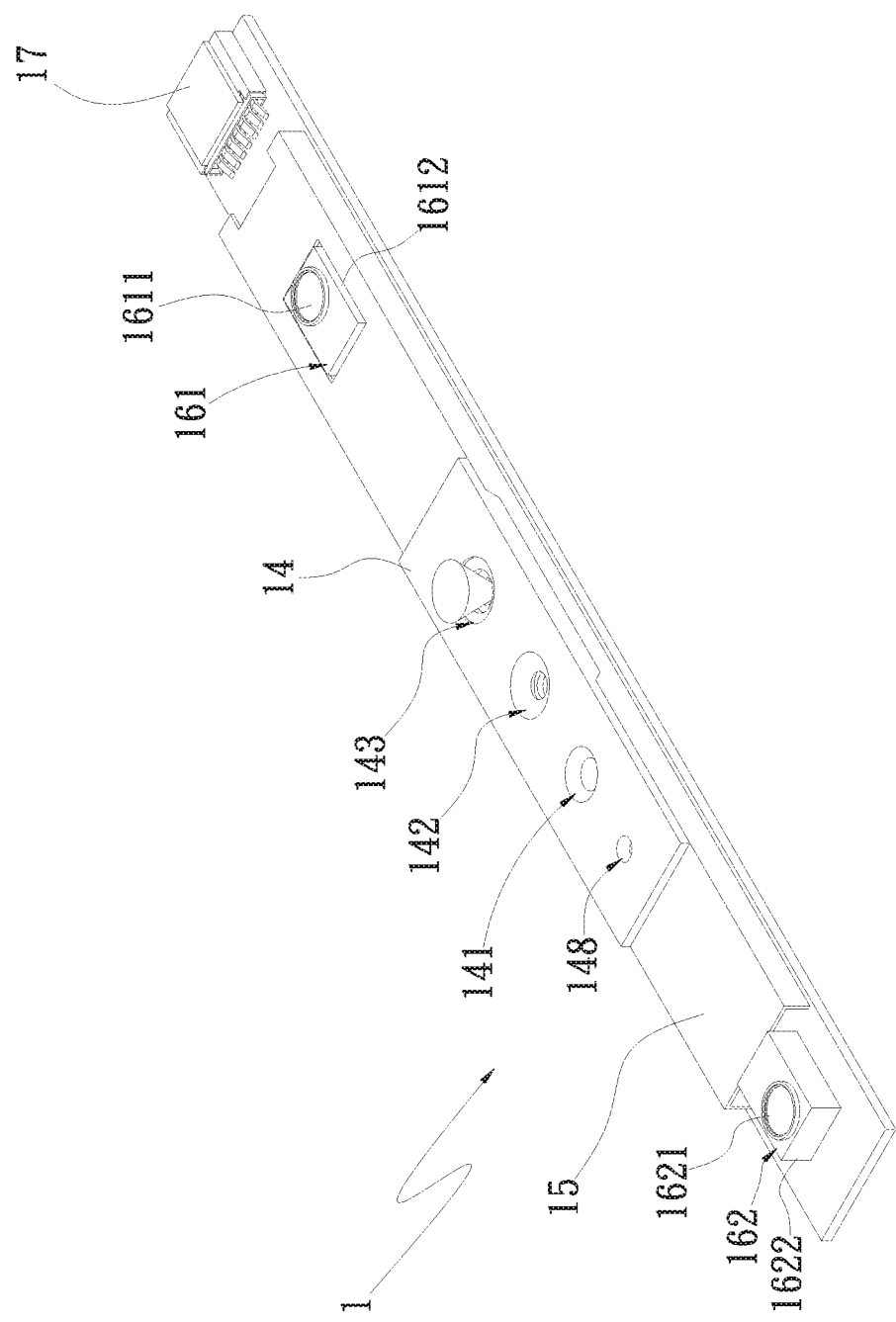
FIG. 5B is a perspective assembled view of the second embodiment of the present invention.
Figure 5C:
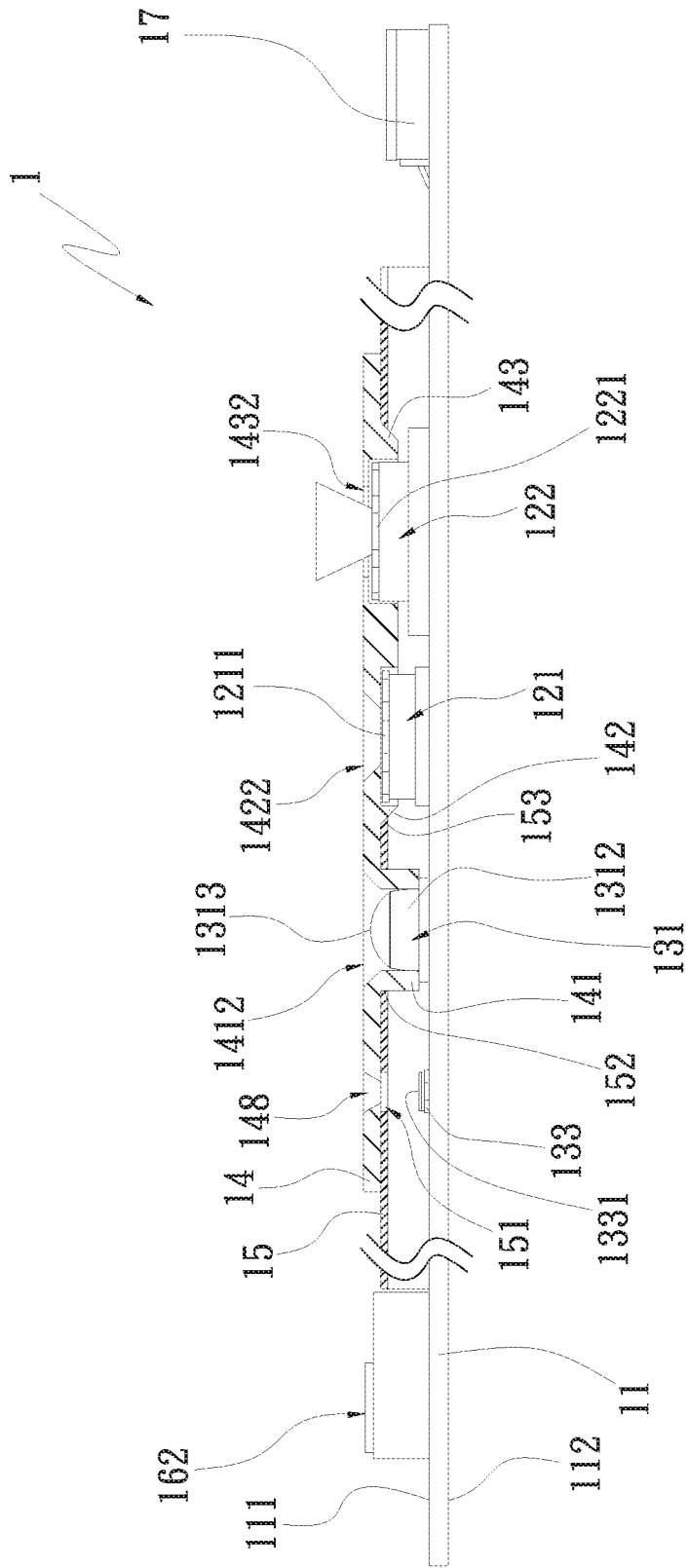
FIG. 5C is a sectional view of the second embodiment of the present invention.
Figure 6:
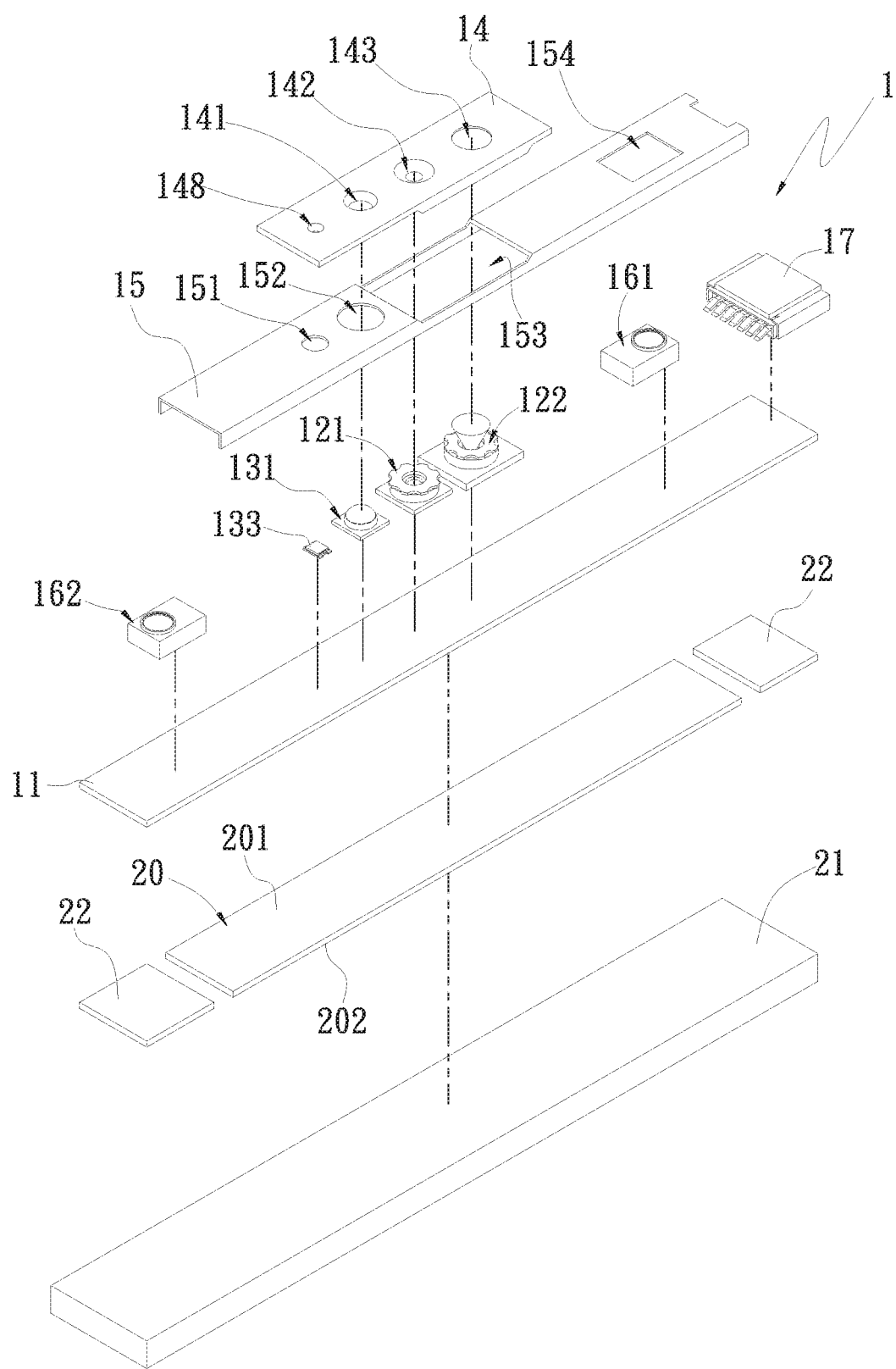
FIG. 6 is a perspective exploded view of a modified embodiment of the present invention.

Please now refer to FIGS. 5A, 5B, 5C and 6. FIG. 5A is a perspective exploded view of a second embodiment of the present invention. FIG. 5B is a perspective assembled view of the second embodiment of the present invention. FIG. 5C is a sectional view of the second embodiment of the present invention. FIG. 6 is a perspective exploded view of a modified embodiment of the present invention. Also referring to FIG. 4, the second embodiment is substantially identical to the first embodiment in structure, connection relationship and effect and thus will not be redundantly described hereinafter. The second embodiment is different from the first embodiment in that the image capturing device 1 further includes a case 15 disposed between the connection body 14 and the circuit board 11. The case 15 is a metal case for protecting the circuits (not shown), the visible indication light-emitting component 133, the IR light-emitting component 131, the first and second lens sets 121, 122, the processor 19 and the first audio pickup module 161 on the circuit board 11. The case 15 is formed with multiple windows in positions where the light source module 13, the image capturing module 12 and the first audio pickup module 161 are enclosed. In this embodiment, there are four windows, wherein a first window 151 correspondingly communicates with the perforation 148 of the connection body 14 and the visible indication light-emitting component 133. The first connection section 141 of the connection body 14 is correspondingly plugged in the second window 152. The second and third connection sections 142, 143 are correspondingly plugged in the third window 153. The first audio pickup module 161 is exposed in the corresponding fourth window 154. Therefore, the IR light-emitting component 131 and the first and second lens sets 121, 122 are respectively independently enclosed and isolated by the first, second and third connection sections 141, 142, 143 of the connection body 14. This can effectively prevent the light from being refracted from the inner side of the case 15 to the lenses to cause the problems of image refraction and light scattering on the case 15.

In a preferred embodiment, the case 15 is a case made of plastic material. In addition, the case 15 and the connection body 14 can be integrally formed by means of injection molding to form a case 15 with the connection body 14 as a part of the case 15.

As shown in FIG. 6, according to a modified embodiment, the image capturing device 1 further includes a heat dissipation module 20, a heat dissipation base seat 21 and multiple electro-conductive pads 22. The lower side 112 of the circuit board 11 is attached to the heat dissipation module 20. In this embodiment, the heat dissipation module 20 is a solid metal plate with high heat conductivity. In practice, the heat dissipation module 20 can also be one of a vapor chamber, a thin heat pipe or a heat plate. The heat dissipation module 20 has a heat absorption face 201 and a heat dissipation face 202. The heat absorption face 201 is in contact and attachment with the lower side 112 of the circuit board 11 for absorbing the heat generated by components on the circuit board 11. The heat dissipation base seat 21 is connected with the circuit board 11. The heat dissipation module 20 and the electro-conductive pads 22 are positioned between the circuit board 11 and the heat dissipation base seat 21. In addition, the heat dissipation face 202 of the heat dissipation module 20 is attached to an upper surface of the heat dissipation base seat 21, whereby the heat dissipation face 202 of the heat dissipation module 20 can receive the heat and conduct the heat to the heat dissipation base seat 21 to quickly dissipate the heat outward.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. An image capturing device comprising:
a circuit board having an upper side and a lower side;
a light source having an IR light-emitting component having a lens and disposed on the upper side of the circuit board and electrically connected therewith; and
a first lens set and a second lens set, the first and second lens sets being respectively disposed on the upper side of the circuit board and electrically connected therewith, either or both of the first lens set and the second lens set being used for capturing an image illuminated by said light source;
a connection body correspondingly disposed above the light source, the connection body having a first connection section, the first connection section having a first open end and a second open end corresponding to the first open end, the first open end abutting against the IR light-emitting component or the upper side of the circuit board in adjacency to the IR light-emitting component, the first and second open ends together defining a first light passage, the IR light-emitting component being positioned in the first light passage.

2. The image capturing device as claimed in claim 1, wherein the IR light-emitting component has a base seat and a lens disposed on the base seat, the first open end outward extending from the connection body abutting against the base seat, the lens of the IR light-emitting component being positioned in the first light passage, a light-emitting face of the lens of the IR light emitting component facing the second open end.

3. The image capturing device as claimed in claim 1, wherein the connection body is formed with a perforation in adjacency to the first connection section.

4. The image capturing device as claimed in claim 3, wherein the light source further includes a visible indication light-emitting component, the visible indication light-emitting component being disposed on the upper side of the circuit board in adjacency to the IR light-emitting component, a light-emitting face of the visible indication light-emitting component facing the perforation.

5. The image capturing device as claimed in claim 1, wherein the connection body further has a second connection section disposed on the connection body corresponding to the first lens set, the second connection section having a third open end and a fourth open end corresponding to the third open end, the third open end outward extending from the connection body to abut against the first lens set, the third and fourth open ends together defining a second light passage, a lens of the first lens set being positioned in the second light passage to face the fourth open end.

6. The image capturing device as claimed in claim 5, wherein the connection body further has a third connection section disposed on the connection body corresponding to the second lens set, the third connection section having a fifth open end and a sixth open end corresponding to the fifth open end, the fifth open end outward extending from the connection body to abut against the second lens set, the fifth and sixth open ends together defining a third light passage, a lens of the second lens set being positioned in the third light passage to face the sixth open end.

7. The image capturing device as claimed in claim 6, further comprising a case, a first audio pickup microphone, a second audio pickup microphone and a connector, the first and second audio pickup microphones and the connector being disposed on the upper side of the circuit board and electrically connected therewith, the case being disposed between the connection body and the circuit board, the case being formed with multiple windows in positions where the lens of the IR light emitting component, the first and second lens and the first audio pickup microphone are enclosed, the first audio pickup microphone being exposed in a corresponding window of the case, the first, second and third connection sections being correspondingly plugged in two other corresponding windows of the case.

8. The image capturing device as claimed in claim 1, further comprising a heat dissipator, the lower side of the circuit board being attached to the heat dissipator, the heat dissipator having a heat absorption face and a heat dissipation face, the heat absorption face being in contact and attachment with the lower side of the circuit board.

9. The image capturing device as claimed in claim 8, wherein the heat dissipator comprises a heat dissipation base seat and multiple electro-conductive pads, the heat dissipation base seat being connected with the circuit board, the heat dissipation module and the electro-conductive pads are positioned between the circuit board and the heat dissipation base seat, the heat dissipation face of the heat dissipator being attached to an upper surface of the heat dissipation base seat.

10. The image capturing device as claimed in claim 1, further comprising a processor electrically connected with the circuit board.

11. The image capturing device as claimed in claim 1, wherein the circuit board is a flexible printed circuit board or a rigid printed circuit board and the connection body is a nontransparent soft pad or nontransparent hard pad.

12. The image capturing device as claimed in claim 1, wherein the first lens set is an infrared lens and the second lens set is a CCD lens.

13. The image capturing device as claimed in claim 4, wherein the IR light-emitting component is an infrared light-emitting diode and the indication light-emitting component is a visible light-emitting diode.

14. The image capturing device as claimed in claim 7, wherein the first audio pickup microphone has a first nontransparent soft pad enclosing the first microphone, a sound hole of the first microphone being uncovered by the first nontransparent soft pad.

15. The image capturing device as claimed in claim 14, wherein the second audio pickup microphone has a a second nontransparent soft pad enclosing the second microphone, a sound hole of the second microphone being uncovered by the second nontransparent soft pad.

16. The image capturing device as claimed in claim 7, wherein the connector is a USB connector, a C-type USB connector, a flexible flat cable connector or a wireless transceiver.

* * * * *